United States Patent
Huang et al.

(10) Patent No.: US 10,075,181 B2
(45) Date of Patent: Sep. 11, 2018

(54) ΔΣ MODULATOR WITH EXCESS LOOP DELAY COMPENSATION (71) Applicants: Sheng-Jui Huang, Wellesley, MA (US); Nathan Egan, Burlington, MA (US); Divya Kesharwani, Woburn, MA (US); Michael A. Ashburn, Jr., Groton, MA (US); Frank Op 't Eynde, Wilsele (BE)

(72) Inventors: Sheng-Jui Huang, Wellesley, MA (US); Nathan Egan, Burlington, MA (US); Divya Kesharwani, Woburn, MA (US); Michael A. Ashburn, Jr., Groton, MA (US); Frank Op 't Eynde, Wilsele (BE)

(73) Assignee: MediaTek Inc., Hsin-Chu (TW)

( * ) Notice: Subject to any disclaimer, the term of this patent is extended or adjusted under 35 U.S.C. 154(b) by 0 days.

(21) Appl. No.: 15/703,840

(22) Filed: Sep. 13, 2017

(65) Prior Publication Data
US 2018/0006661 A1 Jan. 4, 2018

Related U.S. Application Data (63) Continuation-in-part of application No. 15/461,502, filed on Mar. 17, 2017, which is a continuation of
(Continued)

(51) Int. Cl.
*H03M 3/00* (2006.01)

(52) U.S. Cl.
CPC .......... *H03M 3/422* (2013.01); *H03M 3/464* (2013.01)

(58) Field of Classification Search
CPC .......... H03M 3/454; H03M 1/00; H03M 3/30; H03M 3/368; H03M 3/438
(Continued)

(56) References Cited

U.S. PATENT DOCUMENTS 8,344,921 B2  1/2013 Lin et al.
8,471,743 B2*  6/2013 Huang .................. H03M 1/502
                                                       341/143
(Continued)

OTHER PUBLICATIONS

Bolatkale et al., 27.1 A 4GHz CT ΔΣ ADC with 70dB DR and −74dBFS THD in 125MHz BW. 2011 IEEE International Solid-State Circuits Conference. 2011:469-470. 3 pages.
(Continued)

*Primary Examiner* — Linh Nguyen
(74) *Attorney, Agent, or Firm* — Wolf, Greenfield & Sacks, P.C.

(57) ABSTRACT

According to at least one aspect, a delta sigma modulator circuit is provided. The delta sigma modulator circuit includes a first signal processor circuit configured to receive an input signal and a feedback signal and generate a processed signal using the input signal and the feedback signal, a quantizer configured to generate a digital code using the processed signal, a second signal processor circuit configured to receive the digital code, segment the digital code to form a segmented digital code that is smaller in size than the digital code, and generate a rotated digital code using the segmented digital code at least in part by rotating the segmented digital code to compensate for an excess loop delay in the circuit, and an digital-to-analog converter (DAC) configured to receive the rotated digital code and generate the feedback signal using the rotated digital code.

20 Claims, 7 Drawing Sheets

Related U.S. Application Data application No. 15/069,951, filed on Mar. 14, 2016, now Pat. No. 9,634,687.

(60) Provisional application No. 62/173,377, filed on Jun. 10, 2015, provisional application No. 62/393,689, filed on Sep. 13, 2016.

(58) Field of Classification Search
USPC .......................................................... 341/143
See application file for complete search history.

(56) References Cited

U.S. PATENT DOCUMENTS

| | | | | |
|---|---|---|---|---|
| 8,593,318 | B2 * | 11/2013 | Kaald | H03M 3/37 341/143 |
| 9,634,687 | B2 | 4/2017 | Huang et al. | |
| 2002/0175846 | A1 | 11/2002 | Sakimura | |
| 2003/0151528 | A1 * | 8/2003 | Adams | H03M 1/0665 341/50 |
| 2005/0068213 | A1 | 3/2005 | Fontaine et al. | |
| 2006/0164276 | A1 * | 7/2006 | Luh | H03M 1/0668 341/155 |
| 2010/0052959 | A1 * | 3/2010 | Huang | H03M 3/338 341/143 |
| 2010/0066577 | A1 * | 3/2010 | Huang | H03F 1/0277 341/143 |
| 2012/0068865 | A1 * | 3/2012 | Chae | H03M 1/067 341/110 |
| 2012/0112936 | A1 * | 5/2012 | Huang | H03M 1/502 341/110 |
| 2012/0112943 | A1 | 5/2012 | Lin et al. | |
| 2013/0187804 | A1 * | 7/2013 | Kaald | H03M 3/37 341/143 |
| 2013/0342377 | A1 * | 12/2013 | Lin | H03M 1/48 341/143 |
| 2014/0247169 | A1 | 9/2014 | Pinna | |
| 2016/0365870 | A1 | 12/2016 | Huang et al. | |
| 2017/0194984 | A1 | 7/2017 | Huang et al. | |

OTHER PUBLICATIONS

Ho et al., A 23mW, 73dB Dynamic Range, 80MHz BW Continuous-Time Delta-Sigma Modulator in 20nm CMOS. 2014 Symposium on VLSI Circuits Digest of Technical Papers. 2014. 2 pages.

Park et al., 9.5 A 0.13μm CMOS 78dB SNDR 87mW 20MHz BW CT ΔΣ ADC with VCO-Based Integrator and Quantizer. 2009 IEEE International Solid-State Circuits Conference. 2009;170-1. 3 pages.

Wu et al., 15.6 A 160MHz-BW 72dB-DR 40mW Continuous-Time ΔΣ Modulator in 16nm CMOS with Analog ISI—Reduction Technique. 2016 IEEE International Solid-State Circuits Conference. 2016:280-1. 3 pages.

Keller et al., A Comparative Study on Excess-Loop-Delay Compensation Techniques for Continuous-Time-Sigma-Delta Modulators. IEEE Transactions on Circuits and Systems-I: Regular Papers. Dec. 2008;55(11):3480-7.

Park et al., A 78 dB SNDR 87 mW 20 mhZ Bandwidth Continuous-Time ΔΣADC with VCO-Based Integrator and Quantizer Implemented in 0.13 μm CMOS. IEEE Journal of Solid-State Circuits. Dec. 2009; 44(12):3344-58.

Tsai et al., A 64-fJ/Conv.-Step Continuous-Time ΣαModulator in 40-nm CMOS Using Asynchronous SAR Quantizer and Digital ΔΣ Truncator. IEEE Journal of Solid-State Circuits. Nov. 2013;48(11):2637-48.

\* cited by examiner

ΔΣ MODULATOR WITH EXCESS LOOP DELAY COMPENSATION

CROSS REFERENCE TO RELATED APPLICATIONS

This application is a non-provisional of U.S. Provisional Application Ser. No. 62/393,689 titled "VCO-BASED CT DELTA SIGMA ADC WITH PHASE-DOMAIN ELD COMPENSATION USING 128-STATE SEGMENTED ROTATOR," filed Sep. 13, 2016, which is incorporated by reference in its entirety. This application is also a continuation-in-part of U.S. patent application Ser. No. 15/461,502 titled "VCO-BASED CONTINUOUS-TIME SIGMA DELTA MODULATOR EQUIPPED WITH TRUNCATION CIRCUIT AND PHASE-DOMAIN EXCESS LOOP DELAY COMPENSATION," filed Mar. 17, 2017, which is a continuation of U.S. patent application Ser. No. 15/069,951 titled "VCO-BASED CONTINUOUS-TIME SIGMA DELTA MODULATOR EQUIPPED WITH TRUNCATION CIRCUIT AND PHASE-DOMAIN EXCESS LOOP DELAY COMPENSATION," filed Mar. 14, 2016, which is a non-provisional of U.S. Provisional Application No. 62/173,377 titled "TRUNCATION CIRCUIT AND EXCESS LOOP DELAY COMPENSATION FOR VCO-BASED CONTINUOUS-TIME SIGMA DELTA MODULATOR," filed Jun. 10, 2015, each of which is incorporated by reference in its entirety.

BACKGROUND

1. Technical Field

The techniques described herein relate to techniques for reducing the complexity of delta sigma (ΔΣ) modulator circuits such as continuous time (CT) ΔΣ modulator circuits in CT ΔΣ analog-to-digital converters (ADCs).

2. Discussion of the Related Art

Delta sigma (ΔΣ) analog-to-digital converters (ADCs) have become more popular because they overcome some inherent problems of other types ADCs. For example, other types of ADCs may inconveniently require highly accurate analog circuitry. In contrast, ΔΣ ADCs relax the requirements on analog circuitry at the tolerable expense of a higher sampling frequency. However, ΔΣ ADCs exhibit several non-idealities, such as excess loop delay (ELD). The ELD may be caused by the non-ideal nature of electronic components, such as transistors, in ΔΣ ADCs. For example, ELD may be introduced by the non-zero switching time of transistors in the ΔΣ ADC. The ELD undesirably causes the overall signal and noise transfer function of the ΔΣ ADC to be shifted. Thus, ΔΣ ADCs typically include circuitry for ELD compensation to reduce the ELD in the ΔΣ ADC. The ELD compensation circuitry typically compensates for the ELD through a feedback loop where a delayed version of an output digital code is combined with a current version of another digital code in the ΔΣ ADC to form the output digital code.

SUMMARY

According to at least one aspect, a delta sigma modulator circuit is provided. The delta sigma modulator circuit comprises a first signal processor circuit configured to receive an input signal and a feedback signal and generate a processed signal using the input signal and the feedback signal, a quantizer configured to generate a digital code using the processed signal, a second signal processor circuit configured to receive the digital code, segment the digital code to form a segmented digital code that is smaller in size than the digital code, and generate a rotated digital code using the segmented digital code at least in part by rotating the segmented digital code to compensate for an excess loop delay in the circuit, and an digital-to-analog converter (DAC) configured to receive the rotated digital code and generate the feedback signal using the rotated digital code.

In some embodiments, the first signal processor circuit is configured to generate the processed signal at least in part by combining the feedback signal with the input signal to generate a combined signal and filtering the combined signal to generate the processed signal. In some embodiments the digital code is coded using at least one coding scheme selected from the group consisting of: a phase-coding scheme and a thermometer-coding scheme.

In some embodiments, the digital code comprises a plurality of bits in a plurality of non-overlapping subsets of bits and wherein the second signal processor circuit is configured to generate the segmented digital code at least in part by identifying at least one most-significant bit (MSB) from each of the plurality of non-overlapping subsets of bits and identifying at least one least significant bit (LSB) from one of the plurality of non-overlapping subsets of bits. In some embodiments, the segmented digital code comprises a first portion and a second portion and wherein the second signal processor circuit is configured to generate the first portion of the segmented digital code using the identified at least one MSB from each of the plurality of non-overlapping subsets and generate the second portion of the segmented digital code using the identified at least one LSB from one of the plurality of non-overlapping subsets. In some embodiments, the rotated digital code comprises a first portion and a second portion and wherein the second signal processor circuit is configured to generate the first portion of the rotated digital code at least in part by rotating the first portion of the segmented digital code and configured to generate the second portion of the rotated digital code at least in part by rotating the second portion of the segmented digital code. In some embodiments, the DAC is a segmented DAC comprising a first DAC configured to receive the first portion of the rotated digital code and a second DAC configured to receive the second portion of the rotated digital code that is different from the first DAC.

In some embodiments, the second signal processor is configured to rotate the segmented digital code using at least a portion of a previously generated rotated digital code. In some embodiments, the delta sigma modulator circuit is integrated into an analog-to-digital converter (ADC) such as a continuous time delta sigma ADC.

According to at least one aspect, a delta sigma modulator circuit is provided. The delta sigma modulator circuit comprises a signal processor circuit configured to receive an input signal and a feedback signal and generate a processed signal using the input signal and the feedback signal, a quantizer configured to generate a digital code using the processed signal, a rotating splitter configured to receive the digital code and segment the digital code to form a segmented digital code that is smaller in size than the digital code, a rotation circuit configured to receive the segmented digital code and rotate the segmented digital code to generate a rotated digital code, and a DAC configured to receive the rotated digital code and generate the feedback signal using the rotated digital code.

In some embodiments, the signal processor circuit comprises a combiner configured to combine the feedback signal with the input signal to generate a combined signal and a loop filter configured to filter the combined signal to generate the processed signal.

In some embodiments, the digital code comprises a plurality of bits in a plurality of non-overlapping subsets of bits and wherein the rotating splitter is configured to generate the segmented digital code at least in part by: generating a first portion of the segmented digital code comprising at least one MSB from each of the plurality of non-overlapping subsets of bits; and generating a second portion of the segmented digital code comprising at least one LSB from one of the plurality of non-overlapping subsets of bits. In some embodiments, the rotating splitter comprises a first gate array associated with a first subset of bits from the plurality of non-overlapping subsets of bits that comprises a first XOR gate having a first input configured to receive a state of an MSB from the first subset of bits and a second input configured to receive a state of an LSB from the first subset of bits and a second gate array associated with a second subset of bits from the plurality of non-overlapping subsets of bits that comprises a second XOR gate having a first input configured to receive a state of an MSB of the second subset of bits and a second input configured to receive a state of an LSB from the second subset of bits. In some embodiments, the rotating splitter comprises an OR gate having a first input configured to receive an output of the first XOR gate and a second input configured to receive an output of the second XOR gate.

In some embodiments, the rotation circuit comprises a first rotator set comprising one or more rotators and being configured to generate a first portion of the rotated digital code at least in part by rotating the first portion of the segmented digital code and a second rotator set comprising one or more rotators and being configured to generate a second portion of the rotated digital code at least in part by rotating the second portion of the segmented digital code. In some embodiments, the DAC is a segmented DAC comprising a first DAC configured to receive the first portion of the rotated digital code and a second DAC configured to receive the second portion of the rotated digital code that is different from the first DAC.

In some embodiments, the first portion of the segmented digital code is coded in a first coding scheme and the second portion of the segmented digital code is coded in a second coding scheme that is different from the first coding scheme. In some embodiments, the circuit further comprises a conversion circuit configured to convert an input code from being coded in the first coding scheme to being coded in the second coding scheme. In some embodiments, the conversion circuit is integrated into the DAC (e.g., the segmented DAC). In some embodiments, the conversion circuit is integrated into a signal processor circuit that also comprises the rotating splitter and the rotation circuit.

According to at least one aspect, a method of performing delta sigma modulation is provided. The method comprises receiving an input signal, generating a processed signal using the input signal and a feedback signal, digitizing the processed signal to generate a digital code, segmenting the digital code to form a segmented digital code that is smaller in size than the digital code, rotating the segmented digital code to compensate for an excess loop delay and form a rotated digital code, and generating the feedback signal at least in part by converting the rotated digital code into an analog signal.

In some embodiments, the digital code comprises a plurality of bits in a plurality of non-overlapping subsets of bits and wherein segmenting the digital code comprises identifying at least one most-significant bit (MSB) from each of the plurality of non-overlapping subsets of bits, generating a first portion of the segmented digital code using the identified at least one MSB from each of the plurality of non-overlapping subsets, identifying at least one least significant bit (LSB) from one of the plurality of non-overlapping subsets of bits, and generating a second portion of the segmented digital code using the identified at least one LSB from one of the plurality of non-overlapping subsets. In some embodiments, rotating the segmented digital code comprises: generating a first portion of the rotated digital code at least in part by rotating the first portion of the segmented digital code and generating the second portion of the rotated digital code at least in part by rotating the second portion of the segmented digital code.

In some embodiments, the method of performing delta sigma modulation is performed by a delta sigma modulator circuit. Such a delta sigma modulator circuit may be, for example, integrated into an ADC such as a continuous time delta sigma ADC.

The foregoing summary is provided by way of illustration and is not intended to be limiting.

BRIEF DESCRIPTION OF DRAWINGS

In the drawings, each identical or nearly identical component that is illustrated in various figures is represented by a like reference character. For purposes of clarity, not every component may be labeled in every drawing. The drawings are not necessarily drawn to scale, with emphasis instead being placed on illustrating various aspects of the techniques and devices described herein.

DETAILED DESCRIPTION

As mentioned above, delta sigma ($\Delta\Sigma$) analog-to-digital converters (ADCs) typically comprise excess loop delay (ELD) compensation circuits to compensate for ELD caused by the non-ideal nature of electronic components. The ELD compensation circuits typically comprise a feedback loop where a delayed version of an output digital code is combined with a current version of another digital code in the $\Delta\Sigma$ ADC to form the output digital code. Some ELD compensation circuits implement the circuitry that combines the delayed version of the output digital code with another digital code in the $\Delta\Sigma$ ADC using a rotator. The rotator may rotate an input digital code to achieve the same (or similar) effect as subtracting and/or adding another digital code in cases where the digital codes are phase-coded. In a phase-coding scheme, a digital code may comprise no more than one transition from 0 to 1 or 1 to 0 and the location of the transition (in combination with the direction of the transition) may be determinative of the value to which the digital code corresponds. An example phase-coding scheme for a 3-bit digital code is shown below in Table 1.

TABLE 1

Example phase-coding scheme for a 3-bit digital code

| Value | Code |
|---|---|
| 1 | 000 |
| 2 | 100 |
| 3 | 110 |
| 4 | 111 |
| 5 | 011 |
| 6 | 001 |

Given the nature of the phase-coding scheme, the value of a digital code may be changed by rotating the digital code to move the location and/or direction of the transition (and thereby the value of the digital code). For example, a first digital code "100" representative of the value 2 may be subtracted from a second digital code "001" representative of the value 6 by rotating the second digital code by two steps to form a third digital code "111" representative of the value 4.

The inventors have appreciated that implementing a combiner in the ELD compensation circuitry using a rotator offers numerous advantages over other approaches such as allowing two digital codes to be directly combined without having to convert either of the digital codes to analog signals. However, the inventors have further appreciated that implementing such a rotator may be complex given the number of bits that need to be rotated. For example, the rotator may need to rotate digital codes with more than 32 bits (e.g., 64 bits, 128 bits, 256 bits, etc.). Constructing a rotator for such a digital code would be undesirably large and comprise numerous switches.

Accordingly, aspects of the present disclosure relate to new techniques to perform the rotation in the ELD compensation circuitry that requires substantially fewer circuit components, such as switches. In some embodiments, the ELD compensation circuitry is configured to rotate a segmented version of a digital code that is smaller in size than the digital code instead of directly rotating the digital code. Thereby, the total number of bits that need to be rotated is substantially smaller than the entire digital code. For example, the digital code may have 64 bits and a segmented version of the digital code may have only 20 bits. In this example, the 20 bit segmented version of the digital code may be rotated in place of the entire 64 bit digital code.

Figure 1:
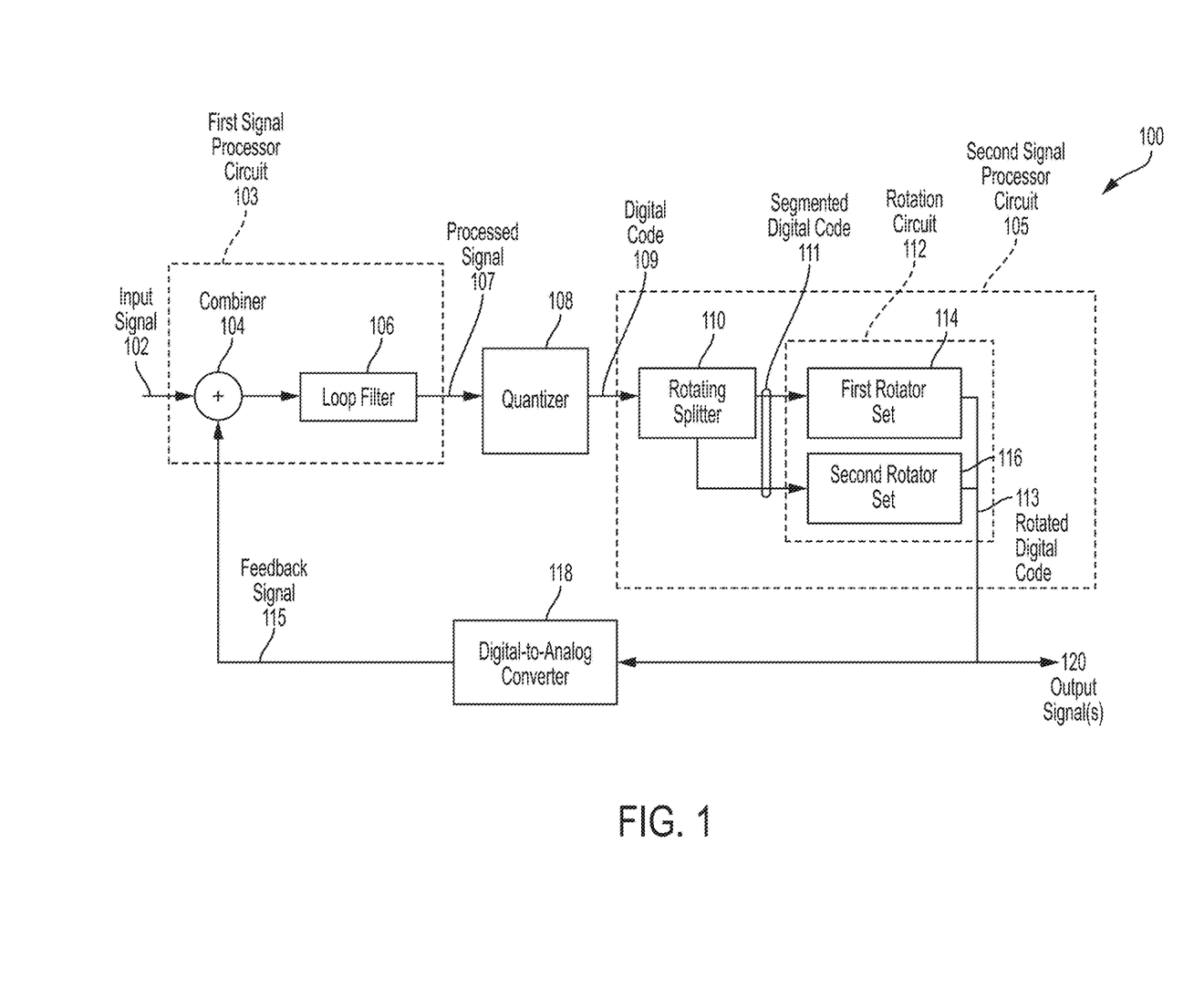
FIG. 1 shows a diagram of a delta sigma ($\Delta\Sigma$) modulator circuit, according to some embodiments.

FIG. 1 shows a diagram of a $\Delta\Sigma$ modulator circuit 100 that may be employed in, for example, a continuous time (CT) $\Delta\Sigma$ ADC. As shown, the circuit 100 receives an input 102 (e.g., an analog input signal) and provides one or more output signals 120 (e.g., digital output signals). The circuit 100 comprises a first signal processor circuit 103 that generates a processed signal 107 based on the input signal 102 and a feedback signal 115. The processed signal 107 is provided as an input to a quantizer 108 that generates a digital code 109 using the processed signal 107. The digital code 109 is provided to a second signal processor circuit 105 that is configured to generate a rotated digital code 113 at least in part by rotating the digital code 109. The second signal processor circuit 105 may be configured to rotate the digital code 109 to, for example, compensate for ELD introduced by one or more electronic components, such as switches, in the circuit 100. The rotated digital code 113 may be provided to a digital-to-analog converter (DAC) 118 that generates the feedback signal 115 at least in part by converting the rotated digital code 113 to an analog signal. The rotated digital code 113 may be provided directly as the output signal(s) 120 and/or employed to generate the output signal(s) 120.

The first signal processor 103 may be, for example, an analog signal processor that is configured to receive and process one or more analog signals, such as the input signal 102 and/or the feedback signal 115, to generate the processed signal 107. In some embodiments, the first signal processor circuit 103 is configured to generate the processed signal 107 at least in part by combining the input signal 102 with the feedback signal 115 to form a combined signal. The input signal 102 may be combined with the feedback signal 115 using, for example, a combiner 104. The combined signal may then be filtered to generate the processed signal 107. The combined signal may be filtered using, for example, a loop filter 106 that comprises one or more integrators.

The quantizer 108 may be, for example, configured to quantize the processed signal 107 to generate the digital code 109. The quantizer 108 may be, for example, a voltage controlled oscillator (VCO) based quantizer that comprises one or more VCOs. The VCO-based quantizer may be implemented as a differential VCO-based quantizer or a single-ended VCO-based quantizer. The digital code 109 output by the quantizer 108 may be coded in any of a variety of coding schemes such as a phase-coding scheme and/or a thermometer coding scheme.

The second signal processor 105 may be, for example, a digital signal processor that is configured to receive and process one or more digital signals, such as the digital code 109, to generate the rotated digital code 113. In some embodiments, the second signal processor 105 is configured to rotate the digital code 109 to compensate for ELD in the circuit 100. The second signal processor 105, however, may rotate a segmented version of the digital code 109 that has a fewer number of bits instead of directly rotating the digital code 109. Thereby, fewer switches are required to perform the rotation to obtain the rotated digital code 113. In these embodiments, the second signal processor circuit 105 may generate a segmented digital code 111 from the digital code 109 using a rotating splitter 110 that has fewer bits than the digital code 109. For example, the segmented digital code 111 may have fewer than half the number of bits than the digital code 109. The segmented digital code 111 may be rotated using, for example, a rotation circuit 112 comprising one or more rotators to generate the rotated digital code 113. The segmented digital code 111 may be rotated to, for example, compensate for ELD in the circuit 100. The rotators in the rotation circuit 112 may be implemented in any of a variety of ways using various components such as switches and/or multiplexers, as is appreciated by those of skill in the art.

In some embodiments, the segmented digital code 111 may be divided into a plurality of portions. For example, the segmented digital code 111 may comprise a first portion that is representative of a first subset of the bits in the digital code 109 and a second portion that is representative of a second subset of the bits in the digital code 109 (that is different from the first subset of bits). In these embodiments, the rotating splitter 110 may provide each respective portion of the segmented digital code 111 to a corresponding rotator set (shown as a first rotator set 114 and a second rotator set 116) in the rotation circuit 112. Thereby, each portion of the segmented digital code 111 may be rotated by a respective rotator set to generate the rotated digital code 113.

Figure 5:
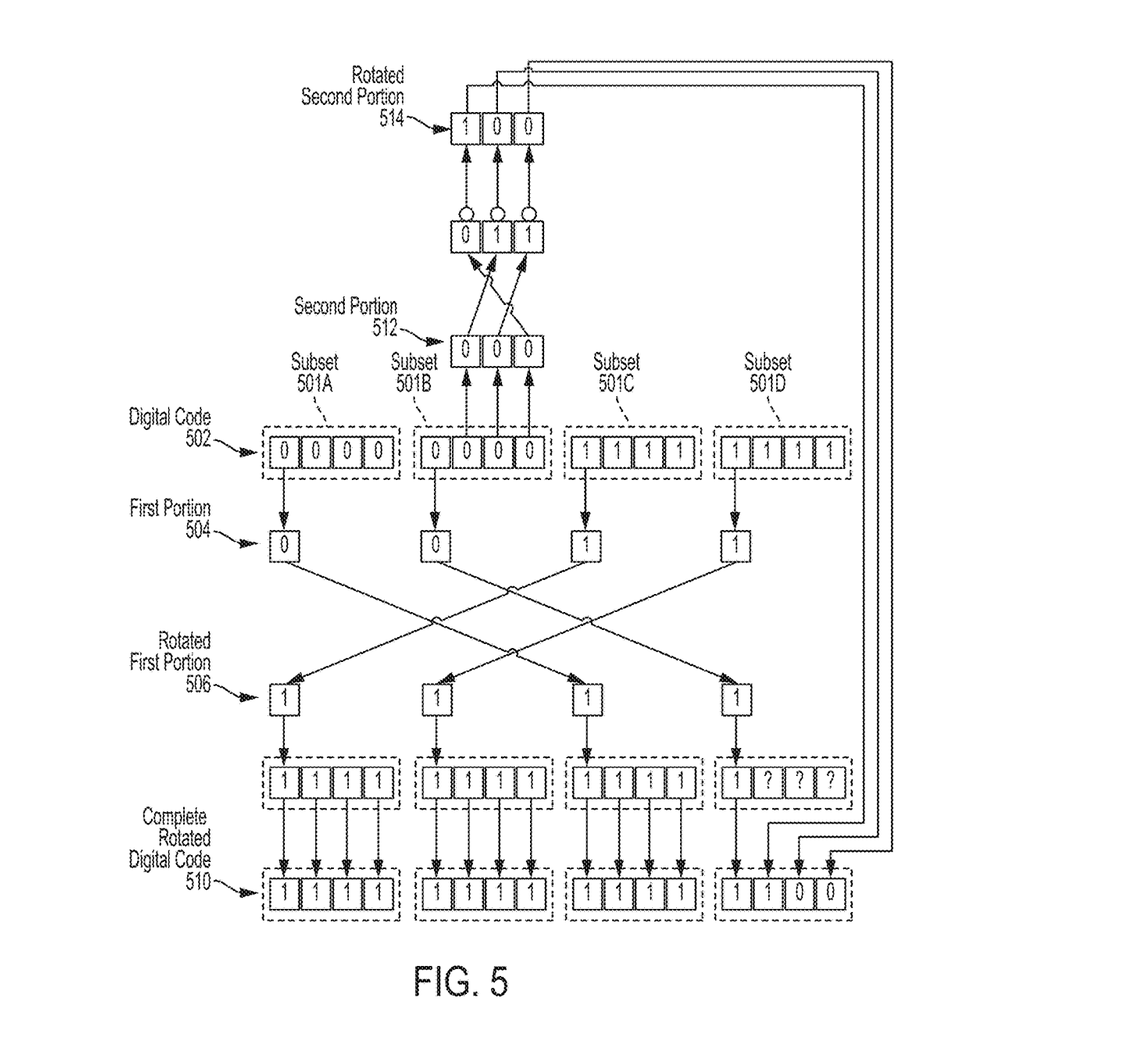
FIG. 5 shows a diagram of a digital code being segmented and rotated, according to some embodiments.

The second signal processor 105 may perform the segmentation and rotation in any of a variety of ways. An example process for segmenting and rotating the digital code is shown in FIG. 5 with a diagram of a digital code being segmented and rotated. As shown, a digital code 502 (0000 0000 1111 1111) comprising 16 bits that is phase-coded is being rotated by 10 steps to the left to form a complete rotated digital code 510 (1111 1111 1111 1100). Directly rotating the 16-bit digital code would require a rotator that is large and complex. Accordingly, the digital code 502 is segmented to form a segmented digital code that comprises a first portion 504 and a second portion 512. The segmented digital code may be generated by, for example, leveraging one or more properties of phase-coded digital signals. For example, a location and direction of a transition from 0 to 1 (or 1 to 0) in the digital code may be representative of the value to which the digital code corresponds. Thereby, information indicative of the location and direction of the transition may be extracted from the digital code to generate the segmented digital code.

In some embodiments, the segmented digital code may be generated by sub-dividing the digital code 502 into a plurality of non-overlapping subsets of bits (shown as subsets 501A-501D) that each have an equal length (e.g., each subset comprises 4 bits). In these embodiments, a most significant bit (MSB) may be identified for each of the plurality of subsets and stored in the first portion 504 of the segmented digital code (e.g., an MSB portion). If the MSB for a given subset has the same value as the MSB of the neighboring subsets, then no 1 to 0 or 0 to 1 transition occurs within the given subset. Thereby, the remaining bits in the given subset must match the MSB and do not need to be stored. If the MSB for a given subset has a different value than the MSB of a neighboring subset, a 1 to 0 or 0 to 1 transition occurs between the MSB for the given set and the MSB for the neighboring subset. Thereby, the bits between these two MSBs (e.g., one or more least significant bits (LSBs)) may be stored in a second portion 512 of the segmented digital code (e.g., an LSB portion). As a result of this segmentation, the entire digital code may be represented with a fewer number of bits. For example, the 16 bit code (0000 0000 1111 1111) may be represented using 7 bits including the first portion 504 (0011) and the second portion 512 (000).

As another illustration, an 8-bit digital code (0001 1111) may be converted into a segmented digital code by: (1) dividing the code into a first subset (0001) and a second subset (1111); (2) identifying an MSB for the first subset (0) and an MSB for the second subset (1); (3) generating a first portion of the segmented digital code using the MSBs (01); (4) identifying one or more LSBs between two neighboring MSBs that are different (001); and (5) generating the second portion of the segmented digital code using the LSBs (001). Thereby, the 8-bit digital code (0001 1111) may be represented as a 5-bit segmented digital code having a first portion with 2-bits (00) and a second portion with 3-bits (001).

The segmented digital code (e.g., the first and second portions 512 and 504, respectively) may be rotated in-place of rotating the entire digital code 502. Thereby, the rotator circuitry only needs to rotate 7 bits instead of 16 bits. Rotating the first portion 504 by one step may be equivalent to rotating the digital code 502 by a number of steps equal to the number of bits in each subset (e.g., 4). Thereby, the first portion 504 may be rotated a number of steps equal to the total number of steps to be shifted divided by the number of bits in each subset (disregarding any remainder). For example, the digital code 502 is being shifted by 10 steps and has subsets that comprise 4 bits. In this example, the first portion 504 would be rotated 2 steps because 10 (total number of steps to be shifted) divided by 4 (number of bits in each subset) is 2 plus a remainder of 2, which is disregarded for rotation of the first portion 504. The result of shifting the first portion 504 by 2 steps is shown as rotated first portion 506. The second portion 512 may be rotated, for example, a number of steps equal to the remainder of the total number of steps to be shifted divided by the number of bits in each subset. For example, the second portion 512 may be rotated by 2 steps because the remainder of 10 (total number of steps to be shifted) divided by 4 (number of bits in each subset) is 2. The second portion 512 may need to be inverted in cases where the total rotation of the digital code 502 causes the transition to change direction (e.g., the 1 to 0 transition becomes a 0 to 1 transition or vice-versa), as shown in FIG. 5. The resulting code is shown as rotated second portion 514. The rotated first portion 506 and the rotated second portion 514 may be employed to, for example, reconstruct the digital code 502 after the rotation of 10 steps as shown by the complete rotated digital code 510.

Returning to FIG. 1, the DAC 118 may be configured to generate the feedback signal 115 using the rotated digital code 113. For example, the DAC 118 may be configured to generate the feedback signal 115 by converting the rotated digital signal 113 into an analog signal. The DAC 118 may be implemented as, for example, a segmented DAC. The segmented DAC may comprise a number of DACs equal to the number of portions in the rotated digital code 113. Thereby, each DAC in the segmented DAC may be configured to receive a respective portion of the rotated digital code 113.

Figure 2A:
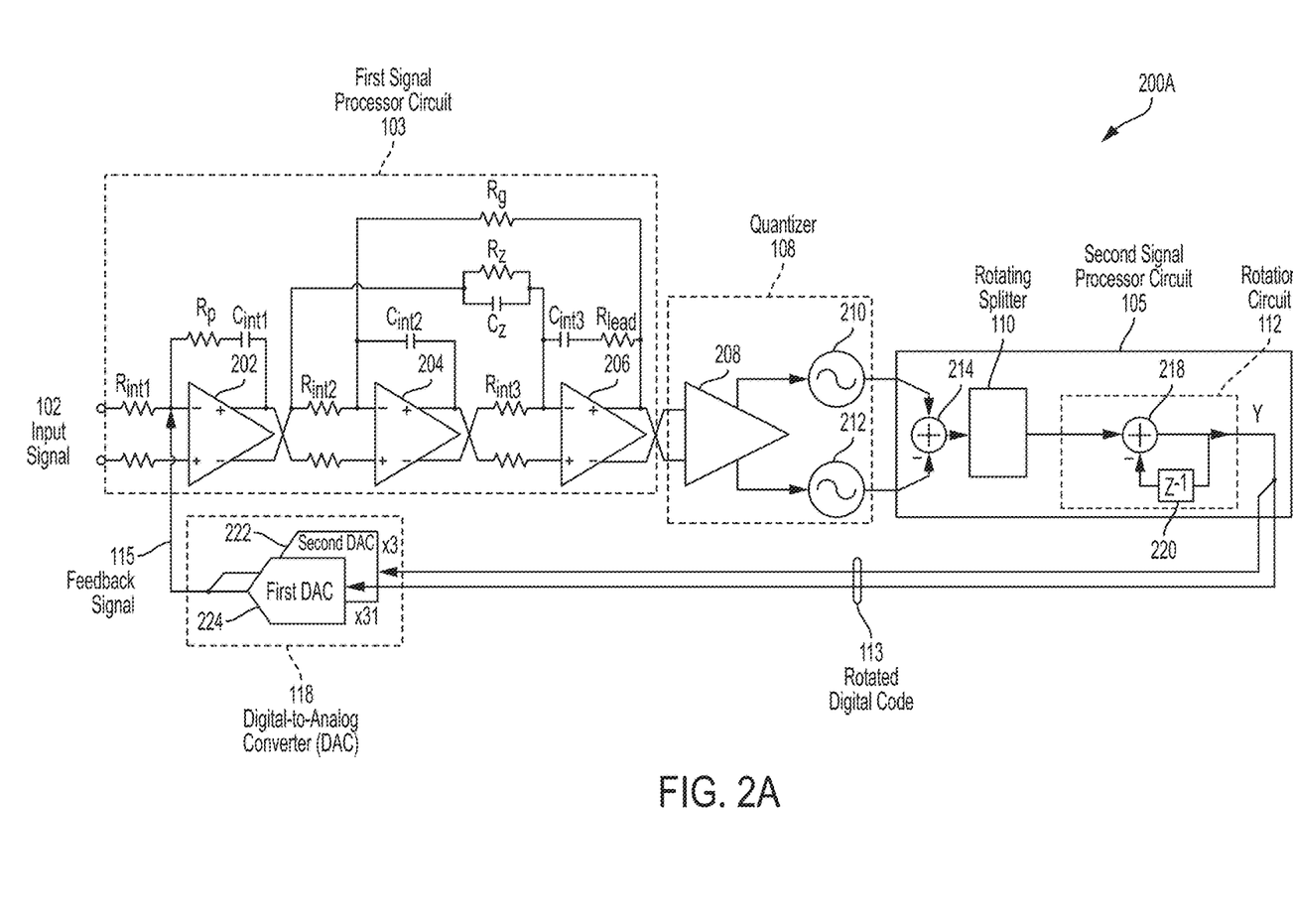
FIG. 2A shows a detailed diagram of a $\Delta\Sigma$ modulator circuit, according to some embodiments.

It should be appreciated that the components shown in FIG. 1 may be implemented in any of a variety of ways using any of a variety of circuit components. An example implementation is shown in FIG. 2A with a detailed diagram of a $\Delta\Sigma$ modulator circuit 200A. The circuit 200A illustrates example implementations of the first signal processor circuit 103, the quantizer 108, the second signal processor circuit 105, and the DAC 118.

The first signal processor circuit 103 shown in circuit 200A comprises a plurality of amplifiers (shown as amplifiers 202, 204, and 206) that are coupled by resistors (shown as resistors $R_{int1}$, $R_{int2}$, $R_{int3}$, $R_p$, $R_g$, and $R_{lead}$) and/or capacitors (shown as capacitors $C_{int1}$, $C_{int2}$, $C_{int3}$, and $C_z$). The amplifiers 202, 204, and/or 206 may be, for example, differential amplifiers that, in combination with the resistors and capacitors, are arranged to form three successive integrators. In particular, the amplifier 202 in combination with the resistor $R_{int1}$ and capacitor $C_{int1}$ may form a first integrator, the amplifier 204 in combination with the resistor $R_{int2}$ and capacitor $C_{int2}$ may form a second integrator, and the amplifier 206 in combination with the resistor $R_{int3}$ and capacitor $C_{int3}$ may form a third integrator. These integrators may be constructed to integrate a combined signal that is formed by combining the input signal 102 with the feedback signal 115.

The quantizer 108 shown in circuit 200A is implemented as a differential VCO-based quantizer that is configured to output a 64 bit digital code that is coded in a phase-coding scheme. The differential VCO-based quantizer comprises a VCO driver 208 that controls (e.g., drives) operation of a first VCO 210 and a second VCO 212 based on an output of the first signal processor 103 (e.g., the processed signal 107). The first VCO 210 may be configured to generate a first version of the digital code and the second VCO 212 may be configured to generate a second version of the digital code.

The second signal processor circuit 105 shown in circuit 200A comprises a combiner 214, a rotating splitter 110, and a rotation circuit 112. The combiner 214 may be configured to combine (e.g., generate a sum of and/or difference between) the first and second versions of the digital code output by the first and second VCOs 210 and 212, respectively. The rotating splitter 112 may be configured to receive the output of the combiner 214 and segment the output to generate a segmented digital code.

The rotation circuit 112 may be configured to receive the segmented digital code and rotate the segmented digital code to compensate for ELD in the circuit 200A. As shown in FIG. 2A, the rotation circuit 112 comprises a combiner 218 and a delay element 220 that form a feedback loop where a delayed version of the rotated digital code 113 is combined with a present version of the segmented digital code output by the rotating splitter 110 to compensate for ELD. In particular, the output of the combiner 218 may be delayed by delay element 220 and input back into the combiner 218 to be combined with the segmented digital code from the rotating splitter 110. The combiner 218 may be implemented using, for example, a rotator in implementations where one or more portions of the segmented digital code are phase-coded. As discussed above, the value that corresponds to a digital coded that is coded using a phase-coding scheme may be determined by the location and direction of a 0 to 1 or 1 to 0 transition. Thereby, the value of the digital code may be changed by rotating the digital to change the location of the transition. Further, the direction of the transition may be changed by shifting the location of the transition beyond the edge of the digital code such that the transition wraps-around to an opposite end of the digital code.

The DAC 118 may be configured to receive the rotated digital code 113 from the second signal processor 105 and convert the rotated digital code 113 to an analog value to generate the feedback signal 115. As shown in FIG. 2A, the DAC 118 may be implemented as a segmented DAC that comprises a DAC for each portion of the rotated digital code. For example, the segmented DAC may comprise a first DAC 224 (e.g., an MSB DAC) configured to receive a first portion of the rotated digital code and a second DAC 222 (e.g., an LSB DAC) configured to receive a second portion of the rotated digital code. The first DAC 224 may be constructed differently than the second DAC 222. For example, the first DAC 224 may have a different number of inputs than the second DAC 222 (e.g., the first DAC 224 is configured to receive 3 bits and the second DAC 222 is configured to receive 31 bits).

Figure 2B:
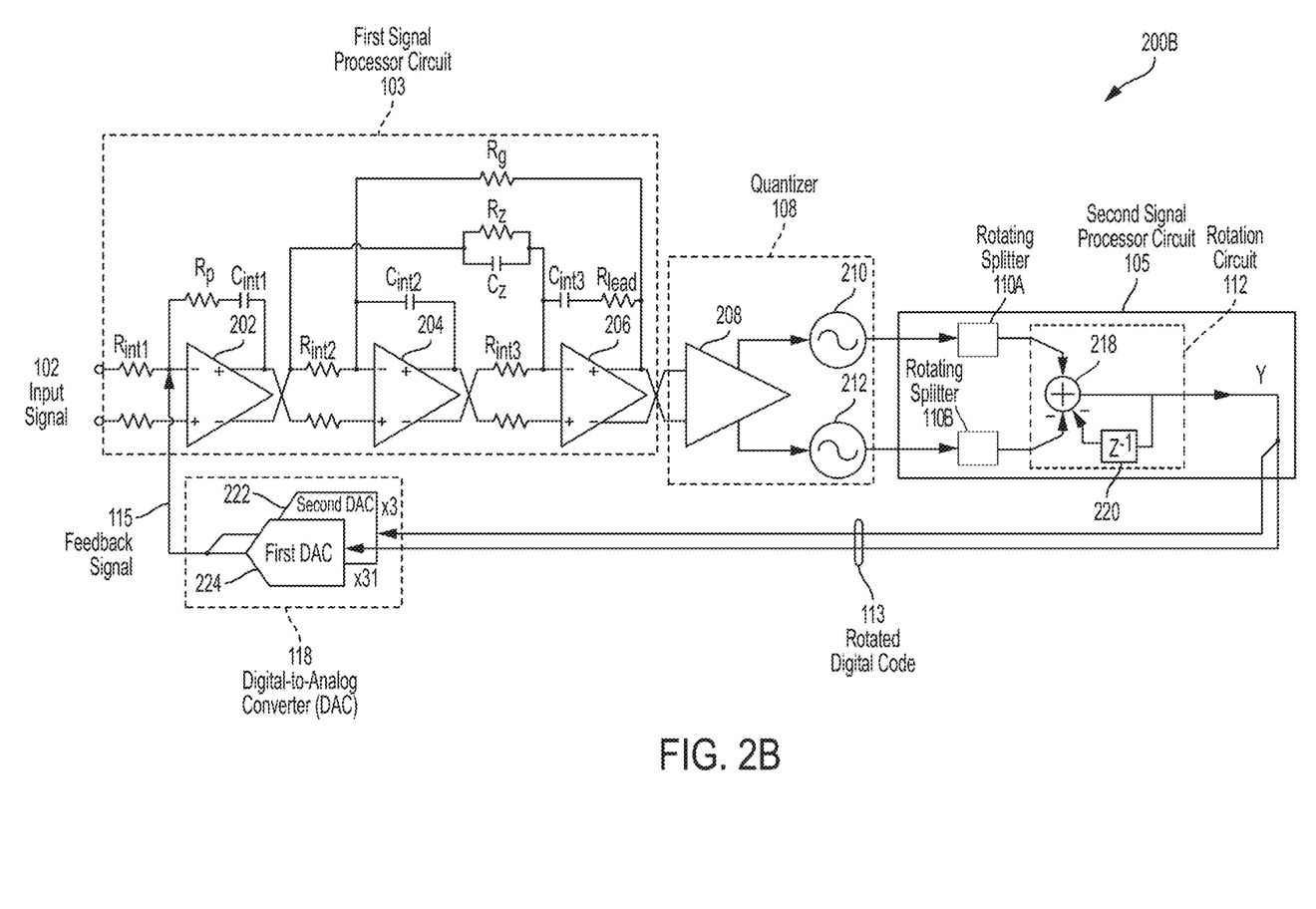
FIG. 2B shows a detailed diagram of another $\Delta\Sigma$ modulator circuit, according to some embodiments.

Another example implementation of the circuit 100 is shown in FIG. 2B with a detailed diagram of a ΔΣ modulator circuit 200B. Relative to ΔΣ modulator circuit 200A in FIG. 2A, the rotation circuit 112 in the ΔΣ modulator circuit 200B is implemented as a differential rotation circuit. In particular, a rotating splitter is used to generate a segmented digital code for the outputs of each of the first VCO 210 and the second VCO 212 (shown as rotating splitters 110A and 110B). The segmented digital code from each of the rotating splitters 110A and 110B is provided to the differential rotation circuit 112 that both combines the segmented codes from each of the two splitters via combiner 218 and rotates the segmented codes to compensate for ELD. Thereby, the functionality of the combiners 214 and 218 in FIG. 2A is merged into a single combiner 218 in FIG. 2B.

Figure 3A:
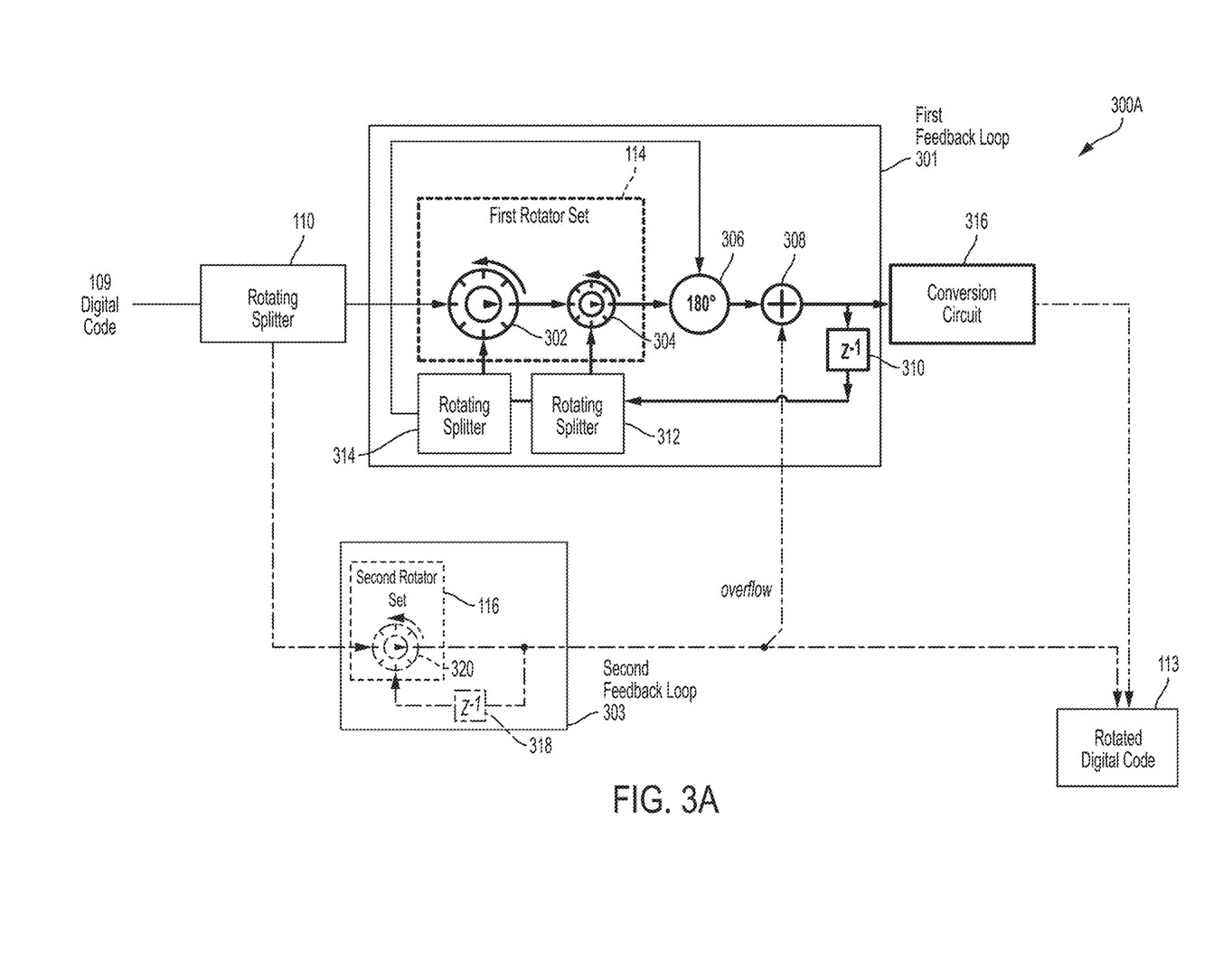
FIG. 3A shows a diagram of a signal processor circuit, according to some embodiments.

FIG. 3A shows a diagram of an example signal processor circuit 300A that may be employed in, for example, the second signal processor 105 in FIGS. 1 and/or 2A described above. As shown, the signal processor circuit 300A comprises the rotating splitter 110 that generates a segmented version of the digital code 109 that may be rotated. As discussed above, the segmented digital code may comprise a first portion (e.g., an MSB portion) and a second portion (e.g., an LSB portion). Each portion of the segmented digital code may be provided to a corresponding feedback loop to generate the rotated digital code 113 that compensates for ELD. For example, the first portion of the segmented digital code may pass through a first feedback loop 301 that comprises the first rotator set 114, an inversion circuit 306, a combiner 308, a delay element 310, and rotating splitters 312 and 314. The second portion of the segmented digital code may pass through a second feedback loop 303 that comprises the second rotator set 116 and a delay element 318. The output of the first feedback loop 301 may be provided to a conversion circuit 316 that converts an input digital code from a first coding scheme (e.g., a phase-coding scheme) to a second coding scheme (e.g., a thermometer-coding scheme) to match a coding scheme of the output of the second feedback loop 303.

The first feedback loop 301 employs a cascade of components (e.g., rotators 302 and 304 and inversion circuit 306) to rotate the first portion of the segmented digital code. Each component in the cascade of components may provide rotation in different step sizes. Thereby, large shifts to the first portion of the segmented digital code may be divided across multiple components. For example, the inversion circuit 306 may be configured to rotate an input digital code with a step size equal to the number of bits in the digital code (e.g., 16 bits), the rotator 302 may be configured to rotate an input digital code with a step size equal to one-fourth the number of bits in the digital code (e.g., 4 bits), and the rotator 304 may be configured to rotate an input digital code with a step size equal to 1 bit. The cascade of components in the first feedback loop 301 may be controlled using, for example, a delayed version of the output of the first feedback loop 301 from the delay element 310 that has passed through rotating splitters 312 and/or 314. The rotating splitters 312 and/or 314 may be configured to, for example, identify a subset of the bits in the delayed version of the output of the first feedback loop 301 to control a component in the cascade of components.

The second feedback loop 303 employs a rotator 320 to rotate the second portion of the segmented digital code. The rotator 320 is controlled based on a delayed version of the output of the second feedback loop 303 from the delay element 318. The second feedback loop 303 may provide one or more overflow bits to the first feedback loop 301 via the combiner 308. The overflow bits may occur from, for example, the rotator 320 rotating the second portion of the segmented digital code more steps than there are bits in the second portion of the segmented digital code (e.g., the rotator 320 rotates the second portion of the segmented digital code by 4 steps when the second portion of the segmented digital code contains 3 bits).

The conversion circuit 316 may be configured to change a coding scheme of the first portion of the rotated digital code. For example, the first portion of the rotated digital code may be coded in a phase-coding scheme and the conversion circuit 316 may be configured to convert the first portion of the rotated digital code from a phase-coding scheme to a thermometer-coding scheme. An example illustration of such a conversion is shown below in Table 2.

TABLE 2

Example 4-bit Phase-Coding to 7-bit Thermometer-Coding Conversion

| Input Phase-Coded Signal (4 bit) | Output Thermometer Coded Signal (7 bit) |
|---|---|
| 1000 | 0000111 |
| 1100 | 0000011 |
| 1110 | 0000001 |
| 1111 | 0000000 |
| 0111 | 1111111 |
| 0011 | 0111111 |
| 0001 | 0011111 |
| 0000 | 0001111 |

Figure 3B:
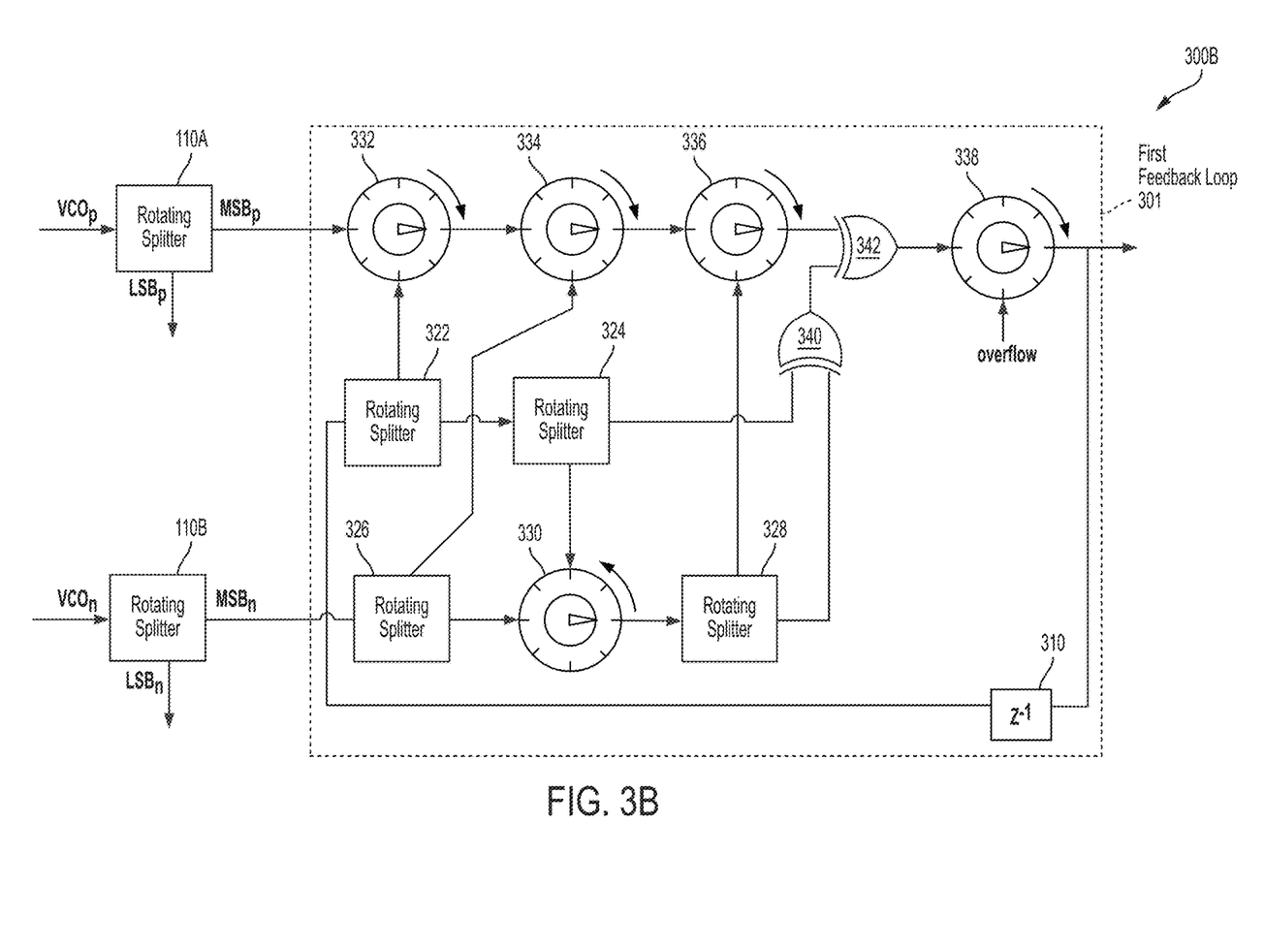
FIG. 3B shows a diagram of another signal processor circuit, according to some embodiments.

FIG. 3B shows a diagram of an example signal processor circuit 300B that may be employed in, for example, the second signal processor 105 in FIGS. 1 and/or 2B described above. In particular, the signal processor circuit 300B implements a differential rotation circuit (such as that shown in FIG. 2B). As shown, the signal processor circuit 300B comprises a first rotating splitter 110A that receives a digital code from the first VCO (shown as $VCO_p$) and segments the received digital code to generate a first portion (shown as $MSB_p$) and a second portion (shown as $LSB_p$). The signal processor circuit 300B also comprises a second rotating splitter 110B that receives a digital code from the second VCO (shown as $VCO_n$) and segments the received digital code to generate a first portion (shown as $MSB_n$) and a second portion (shown as $LSB_n$). The first feedback loop 301 may receive the first portion of the segmented digital codes from each of the first and second rotating splitters 110A and 110B in addition to rotating and combining the first portion of both segmented digital codes. The first feedback loop 301 may combine and rotate the first portion of the segmented digital codes using rotating splitters 322, 324, 326, 328, rotators 330, 332, 334, 336, 338, XOR gates 340, 342, and delay element 310. The output of the first feedback loop 301 may be provided to a conversion circuit (e.g., conversion circuit 316) before being provided to a DAC (e.g., DAC 118). A second feedback loop (not shown) may be employed to separately receive, rotate, and combine the second portions of the segmented codes from the rotating splitters 110A and 110B. Additionally, the second feedback loop may generate the overflow signal that is input into rotator 338.

Figure 4:
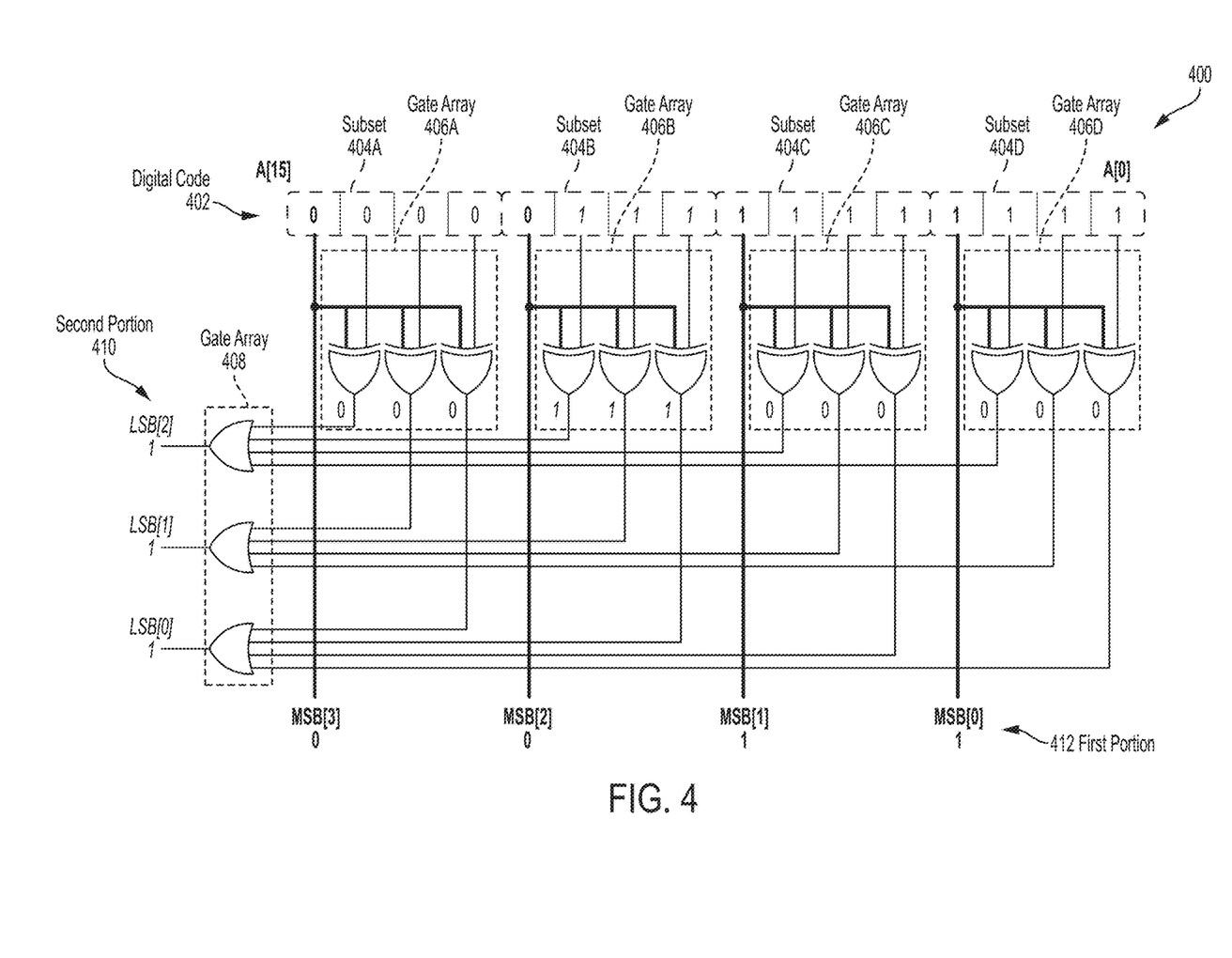
FIG. 4 shows a diagram of a rotating splitter, according to some embodiments.

FIG. 4 shows an example rotating splitter 400 that may be employed as, for example, any of the rotating splitters described herein. As shown, the rotating splitter 400 receives a digital code 402 and generates a first portion of the segmented digital code 412 (e.g., an MSB portion) and a second portion of the segmented digital code 410 (e.g., an LSB portion). The rotating splitter 400 generates the first portion of the segmented digital code 412 by dividing the digital code 402 input a plurality of non-overlapping subsets (shown as subsets 404A-404D) that each comprise the same number of bits (e.g., 4 bits). The MSB from each of these non-overlapping subsets 404A-404D is directly provided as an output to be included in the first portion of the segmented digital code 412. The second portion of the segmented digital code 410 is generated by providing, as an output, the LSBs in the subset that is between two MSBs that are different (e.g., LSBs 111 in subset 404B). These LSBs are detected by employing a gate array (shown as gate arrays 406A-406D) for each of the subsets 404A-404D. Each of the gate arrays 406A-406D comprises an XOR gate for each of the LSBs in a given subset. In particular, each XOR gate has a first input configured to receive a state of the MSB of the respective subset and a second input configured to receive a state of one LSB from the respective subset. The outputs of the XOR gates in the gate arrays 406A-406D may be provided to another gate array (shown as gate array 408). The gate array 408 may comprise a plurality of OR gates with a number of inputs that is equal to the number of non-overlapping subsets in the digital code 402. The output of the OR gates in the gate array 408 may be included in the second portion of the segmented digital code 410.

It should be appreciated that the rotating splitters described herein may not have identical constructions. For example, the rotating splitters 110, 110A, and 110B may have a different construction from rotating splitters 312, 314, 322, 324, 326, and 328. In particular, the rotating splitters 110, 110A, and 110B may be configured to dynamically select a subset of bits to output in at least one of the output portions (e.g., the LSB portion), as shown in FIG. 4 by rotating splitter 400, while the rotating splitters 312, 314, 322, 324, 326, and 328 may be configured to always select the same bits to include in each output portion (e.g., the first output portion is always the first two bits and the second output portion is always the last four bits).

Above embodiments of ΔΣ modulator circuits and associated methods have been described. The techniques described herein may be employed in any of a variety of electronic systems, devices, and/or circuits. For example, any of the ΔΣ modulator circuits described herein may employed in continuous time CT ΔΣ ADCs.

Various aspects of the apparatus and techniques described herein may be used alone, in combination, or in a variety of arrangements not specifically discussed in the embodiments described in the foregoing description and is therefore not limited in its application to the details and arrangement of components set forth in the foregoing description or illustrated in the drawings. For example, aspects described in one embodiment may be combined in any manner with aspects described in other embodiments.

The terms "approximately," "about," and "substantially" may be used to mean within ±4% of a target value in some embodiments. The terms "approximately," "about," and "substantially" may include the target value. It should be appreciated that the terms "approximately," "about," and "substantially" may be used to refer to a range smaller than ±4% of a target value such as: ±2% of a target value, ±1% of a target value, ±0.4% of a target value, ±0.2% of a target value, and ±0.1% of a target value.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:
1. A delta sigma modulator circuit, comprising:
   a first circuit configured to receive an input signal and a feedback signal and generate a processed signal using the input signal and the feedback signal;

a quantizer coupled to the first circuit and configured to generate a digital code comprising a plurality of bits using the processed signal;

a second circuit coupled to the quantizer and configured to receive the digital code, segment the digital code to form a segmented digital code that is smaller in size than the digital code and representative of all of the bits in the digital code, and generate a rotated digital code using the segmented digital code at least in part by rotating the segmented digital code to compensate for an excess loop delay in the circuit; and a digital-to-analog converter (DAC) coupled between the second circuit and the first circuit and configured to receive the rotated digital code and generate the feedback signal using the rotated digital code.

2. The circuit of claim 1, wherein the first circuit is configured to generate the processed signal at least in part by combining the feedback signal with the input signal to generate a combined signal and filtering the combined signal to generate the processed signal.

3. The circuit of claim 1, wherein the digital code is coded using at least one coding scheme selected from the group consisting of: a phase-coding scheme and a thermometer-coding scheme.

4. The circuit of claim 1, wherein the plurality of bits in the digital code is divided into a plurality of non-overlapping subsets of bits and wherein the second circuit is configured to generate the segmented digital code at least in part by identifying at least one most-significant bit (MSB) from each of the plurality of non-overlapping subsets of bits and identifying at least one least significant bit (LSB) from one of the plurality of non-overlapping subsets of bits.

5. The circuit of claim 4, wherein the segmented digital code comprises a first portion and a second portion and wherein the second circuit is configured to generate the first portion of the segmented digital code using the identified at least one MSB from each of the plurality of non-overlapping subsets and generate the second portion of the segmented digital code using the identified at least one LSB from one of the plurality of non-overlapping subsets.

6. The circuit of claim 5, wherein the rotated digital code comprises a first portion and a second portion and wherein the second circuit is configured to generate the first portion of the rotated digital code at least in part by rotating the first portion of the segmented digital code and configured to generate the second portion of the rotated digital code at least in part by rotating the second portion of the segmented digital code.

7. The circuit of claim 6, wherein the DAC is a segmented DAC comprising a first DAC configured to receive the first portion of the rotated digital code and a second DAC configured to receive the second portion of the rotated digital code that is different from the first DAC.

8. The circuit of claim 1, wherein the second circuit is configured to rotate the segmented digital code using at least a portion of a previously generated rotated digital code.

9. A delta sigma modulator circuit, comprising:
a first circuit configured to receive an input signal and a feedback signal and generate a processed signal using the input signal and the feedback signal;
a quantizer coupled to the first circuit and configured to generate a digital code comprising a plurality of bits using the processed signal;
a second circuit coupled to the quantizer and comprising:
a rotating splitter configured to receive the digital code and segment the digital code to form a segmented digital code that is smaller in size than the digital code and representative of all of the bits in the digital code; and
a rotation circuit configured to receive the segmented digital code and rotate the segmented digital code to generate a rotated digital code; and
a digital-to-analog converter (DAC) coupled between the second circuit and the first circuit and configured to receive the rotated digital code and generate the feedback signal using the rotated digital code.

10. The circuit of claim 9, wherein the first circuit comprises:
a combiner configured to combine the feedback signal with the input signal to generate a combined signal; and
a loop filter configured to filter the combined signal to generate the processed signal.

11. The circuit of claim 9, wherein the plurality of bits in the digital code is divided into a plurality of non-overlapping subsets of bits and wherein the rotating splitter is configured to generate the segmented digital code at least in part by:
generating a first portion of the segmented digital code comprising at least one most-significant bit (MSB) from each of the plurality of non-overlapping subsets of bits; and
generating a second portion of the segmented digital code comprising at least one least significant bit (LSB) from one of the plurality of non-overlapping subsets of bits.

12. The circuit of claim 11, wherein the rotating splitter comprises:
a first gate array associated with a first subset of bits from the plurality of non-overlapping subsets of bits that comprises a first XOR gate having a first input configured to receive a state of an MSB from the first subset of bits and a second input configured to receive a state of an LSB from the first subset of bits; and
a second gate array associated with a second subset of bits from the plurality of non-overlapping subsets of bits that comprises a second XOR gate having a first input configured to receive a state of an MSB of the second subset of bits and a second input configured to receive a state of an LSB from the second subset of bits.

13. The circuit of claim 12, wherein the rotating splitter comprises an OR gate having a first input configured to receive an output of the first XOR gate and a second input configured to receive an output of the second XOR gate.

14. The circuit of claim 11, wherein the rotation circuit comprises:
a first rotator set comprising one or more rotators and being configured to generate a first portion of the rotated digital code at least in part by rotating the first portion of the segmented digital code; and
a second rotator set comprising one or more rotators and being configured to generate a second portion of the rotated digital code at least in part by rotating the second portion of the segmented digital code.

15. The circuit of claim 14, wherein the DAC is a segmented DAC comprising a first DAC configured to receive the first portion of the rotated digital code and a second DAC configured to receive the second portion of the rotated digital code that is different from the first DAC.

16. The circuit of claim 11, wherein the first portion of the segmented digital code is coded in a first coding scheme and the second portion of the segmented digital code is coded in a second coding scheme that is different from the first coding scheme.

17. The circuit of claim 16, wherein the second circuit further comprises a conversion circuit configured to convert an input code from being coded in the first coding scheme to being coded in the second coding scheme.

18. A method of operating a delta sigma modulator circuit, comprising:
    receiving, by a first circuit, an input signal;
    generating, by the first circuit, a processed signal using the input signal and a feedback signal;
    digitizing, by a quantizer coupled to the first circuit, the processed signal to generate a digital code comprising a plurality of bits;
    segmenting, by a second circuit coupled to the quantizer, the digital code to form a segmented digital code that is smaller in size than the digital code and representative of all of the bits in the digital code;
    rotating, by the second circuit, the segmented digital code to compensate for an excess loop delay and form a rotated digital code; and
    generating, by a digital-to-analog converter (DAC) coupled between the second circuit and the first circuit, the feedback signal at least in part by converting the rotated digital code into an analog signal.

19. The method of claim 18, wherein the plurality of bits in the digital code is divided into a plurality of non-overlapping subsets of bits and wherein segmenting the digital code comprises:
    identifying at least one most-significant bit (MSB) from each of the plurality of non-overlapping subsets of bits;
    generating a first portion of the segmented digital code using the identified at least one MSB from each of the plurality of non-overlapping subsets;
    identifying at least one least significant bit (LSB) from one of the plurality of non-overlapping subsets of bits; and
    generating a second portion of the segmented digital code using the identified at least one LSB from one of the plurality of non-overlapping subsets.

20. The method of claim 19, wherein rotating the segmented digital code comprises:
    generating a first portion of the rotated digital code at least in part by rotating the first portion of the segmented digital code; and
    generating a second portion of the rotated digital code at least in part by rotating the second portion of the segmented digital code.

* * * * *